United States Patent
Dietz et al.

(10) Patent No.: US 10,453,680 B2
(45) Date of Patent: Oct. 22, 2019

(54) TERAHERTZ ANTENNA AND METHOD FOR PRODUCING A TERAHERTZ ANTENNA

(71) Applicant: FRAUNHOFER-GESELLSCHAFT ZUR FÖRDERUNG DER ANGEWANDTEN FORSCHUNG E.V., München (DE)

(72) Inventors: Roman Dietz, Berlin (DE); Thorsten Göbel, Berlin (DE); Björn Globisch, Berlin (DE); William Ted Masselink, Berlin (DE); Mykhaylo Petrovych Semtsiv, Berlin (DE)

(73) Assignee: FRAUNHOFER-GESELLSCHAFT ZUR FÖRDERUNG DER ANGEWANDTEN FORSCHUNG E.V., München (DE)

( * ) Notice: Subject to any disclaimer, the term of this patent is extended or adjusted under 35 U.S.C. 154(b) by 0 days.

(21) Appl. No.: 16/077,023

(22) PCT Filed: Feb. 10, 2017

(86) PCT No.: PCT/EP2017/053053
§ 371 (c)(1),
(2) Date: Aug. 9, 2018

(87) PCT Pub. No.: WO2017/137589
PCT Pub. Date: Aug. 17, 2017

(65) Prior Publication Data
US 2019/0035625 A1    Jan. 31, 2019

(30) Foreign Application Priority Data
Feb. 12, 2016 (DE) .......... 10 2016 202 216

(51) Int. Cl.
*H01L 21/02* (2006.01)
*C30B 29/40* (2006.01)
(Continued)

(52) U.S. Cl.
CPC ...... *H01L 21/02546* (2013.01); *C30B 23/063* (2013.01); *C30B 29/40* (2013.01);
(Continued)

(58) Field of Classification Search
CPC ......... H01L 21/02546; H01L 21/02631; H01L 21/02581; H01L 21/02543
(Continued)

(56) References Cited

U.S. PATENT DOCUMENTS 8,546,762 B1 * 10/2013 Roehle .................. G01J 3/2889
250/341.1
8,809,092 B2   8/2014 Linfield et al.
(Continued)

FOREIGN PATENT DOCUMENTS

DE    102007063625 A1   12/2008

OTHER PUBLICATIONS

Gicquel-Guezo, M., et al., "290 fs switching time of Fe-doped quantum well saturable absorbers in a microcavity in 1.55 Am range," Applied Physics Letters, vol. 85, No. 24, pp. 5926-5928 (Dec. 13, 2004).
(Continued)

*Primary Examiner* — Lam T Mai
(74) *Attorney, Agent, or Firm* — Maschoff Brennan

(57) ABSTRACT

A terahertz antenna includes at least one photoconductive layer which generates charge carriers upon irradiation of light and two electroconductive antenna elements via which an electric field can be applied to at least one section of the photoconductive layer. The photoconductive layer being doped with a dopant in a concentration of at least $1 \times 10^{18}$ cm$^{-3}$, the dopant being a transition metal. The photoconductive layer is produced by molecular beam epitaxy at a growth temperature of at least 200° C. and not more than
(Continued)

500° C., the dopant being arranged in the photoconductive layer such that it produces a plurality of point defects.

16 Claims, 1 Drawing Sheet

(51) Int. Cl.
*G01J 3/42* (2006.01)
*C30B 23/06* (2006.01)

(52) U.S. Cl.
CPC .......... *G01J 3/42* (2013.01); H01L 21/02543 (2013.01); H01L 21/02581 (2013.01); H01L 21/02631 (2013.01)

(58) Field of Classification Search
USPC .......... 343/700 MS; 250/341.1, 341.8, 338.4
See application file for complete search history.

(56) References Cited

U.S. PATENT DOCUMENTS

| | | | | |
|---|---|---|---|---|
| 8,901,497 | B2* | 12/2014 | Sartorius | G01N 21/3581 250/338.4 |
| 2011/0057206 | A1 | 3/2011 | Sartorius et al. | |
| 2012/0113417 | A1 | 5/2012 | Linfield et al. | |
| 2013/0306869 | A1* | 11/2013 | Sartorius | G01N 21/3581 250/338.4 |
| 2014/0319356 | A1* | 10/2014 | Sartorius | G01N 21/3577 250/341.8 |
| 2016/0372621 | A1* | 12/2016 | Dietz | H01L 31/035281 |

OTHER PUBLICATIONS

Guezo, M., et al., "Nonlinear absorption temporal dynamics of Fe-doped GaInAs/InP multiple quantum wells," Journal of Applied Physics, vol. 94, No. 4, pp. 2355-2359 (Aug. 15, 2003).
Guezo, M., et al., "Ultrashort, nonlinear, optical time response of Fe-doped InGaAs/InP multiple quantum wells in 1.55-μm range," Applied Physics Letters, vol. 82, No. 11, pp. 1670-1672 (Mar. 17, 2003).
Salaün, S., et al., "Semi-Insulating InP: Fe by GSMBE: Optimal Growth Conditions," International Conference on Indium Phosphide and Related Materials, pp. 147-150 (1993).
Brahm, A. et al., "Multichannel Terahertz Time-Domain Spectroscopy System at 1030 nm", Optics Express, vol. 22, No. 11, p. 12982, Jun. 2, 2014.
Dietz, R. et al., "THz generation at 1.55 μm excitation: sis-fold increase in THz conversion efficiency by separated photoconductive and trapping regions", Optic Express, vol. 19, Issue 27, pp. 25911-25917, Dec. 2011.
Dietz, R. et al., "64pW pulsed terahertz emission from growth optimized InGaAs/InAIAs heterostructures with separated photoconductive and trapping regions", Applied Physics Letters, vol. 103, Jul. 2013, No. 6, p. 061103.
Dietz, R. et al., "Low temperature grown Be-doped InGaAs/InAlAs photoconductive antennas excited at 1030 nm", Journal of Infrared, Millimeter, and Terahertz Waves, vol. 34, No. 3-4, pp. 231-237, Mar. 8, 2013.
Dietz, R. et al., "Influence and adjustment of carrier lifetimes in InGaAs/InAIAs photoconductive pulsed terahertz letectors: 6 THz bandwidth and 90dB dynamic range", Optics Express, vol. 22, Aug. 11, 2014, No. 16, p. 19411-19422.
Dietz, R. et al., "All fiber coupled THz-TDS system with kHz measurement rate based on electronically controlled optical sampling", Optics Letters, vol. 39, issue 22, pp. 6482-6485, Nov. 15, 2014.
Dietz, R. et al., "Low temperature grown photoconductive antennas for pulsed 1060 nm excitation: Influence of excess energy on the electron relaxation", Journal of Infrared, Millimeter, and Terahertz Waves, vol. 36, No. 1, pp. 60-71, Nov. 5, 2014.
Dietz, R., "Photoconductive THz emitters and detectors on the basis of InGaAs/InP for teraherz time domain spectroscopy", Dissertation. Philipps-Universitat Marburg, Jan. 2015.
Guillot, G. et al., "Indentification of the Fe acceptor level in Ga0.47In0.53As." Semicond. Sci. Technol. 5, 391-394, Nov. 1990.
Hatem, O. et al., "Terahertz-frequency photoconductive detectors fabricated from metalorganic chemical vapor depositiongrown Fe-doped InGaAs.", Applied Physics Letters 98, 121107, Mar. 23, 2011.
Jung T. et al., "Photoluminescence study of (GaIn)As/(AlIn)As-based THz antenna materials for 1.55 μm excitation", Journal of Luminescence, vol. 138, Jun. 2013, pp. 179-181.
Mohandas, R.A. et al., "Generation of continuous wave terahertz radiation from Fe-doped InGaAs and InGaAsP", IEEE, 40th International Conference Infrared, Millimeter, and Terahertz waves (IRMMW-THz), Aug. 23-28, 2015.
Roehle H. et al., "Next generation 1.5 μm terahertz antennas: mesa-structuring of InGaAs/InAlAs photoconductive layers", Optics Express, vol. 18, Issue 3, pp. 2296-230, Feb. 2010.
Suzuki, M. and Tonouchi, M., "Fe-implanted InGaAs photoconductive terahertz detectors triggered by 1.56 μm femtosecond optical pulse", Applied Physics Letters 86, 163504, Mar. 2005.
Tell, B. et al., "Metalorganic vapor-phase-epitaxial growth of the Fe-doped In0.53Ga0.47As", Journal of Applied Physics, 61 (3), Feb. 1, 1987, pp. 1172-1175.
Vieweg, N. et al., "Terahertz-time domain spectrometer with 90 dB peak dynamic range", Journal of Infrared, Millimeter, and Terahertz Waves, vol. 35, No. 10, pp. 823-832, Jul. 9, 2014.
Wood, C.D. et al., "Terahertz emission from metalorganic chemical vapor deposition grown Fe:InGaAs using 830 nm to 1.55 μm excitation", Applied Physics Letters 96, 194104, May 14, 2010.

\* cited by examiner

US 10,453,680 B2

TERAHERTZ ANTENNA AND METHOD FOR PRODUCING A TERAHERTZ ANTENNA

CROSS-REFERENCE TO A RELATED APPLICATION

This application is a National Phase Patent Application of International Patent Application Number PCT/EP2017/053053, filed on Feb. 10, 2017, which claims priority of German Patent Application 10 2016 202 216.4, filed on Feb. 12, 2016.

BACKGROUND

This invention relates to a terahertz antenna and to a method for producing a terahertz antenna. Known terahertz antennas have at least one photoconductive semiconductor layer which is electrically contacted with antenna elements (e.g. antenna wings) for frequencies in the terahertz range (i.e. for frequencies in the range of 0.1-10 THz). Between the antenna elements, the photoconductive semiconductor layer of such terahertz antennas is illuminated with modulated light, in particular in the form of optical pulses (e.g. with a pulse length in the range of 100 fs) or a radiation modulated at high frequency. The irradiated light generates free charge carriers in the photoconductor, wherein by applying a voltage to the antenna elements the generated modulated charge carriers are accelerated. The accelerated charge carriers generate electromagnetic radiation with the modulation frequency, i.e. the terahertz antenna is operated as a terahertz transmitter.

When the terahertz antenna is operated as a terahertz receiver, a terahertz wave impinging on the photoconductive semiconductor layer induces a voltage between the antenna elements. This voltage causes a photocurrent in the semiconductor when the modulated illumination of the photoconductive semiconductor layer is effected in synchronism with the induced voltage. By measuring a mean photocurrent in dependence on the relative phase position of the terahertz radiation and the illumination modulation, both the amplitude and the phase of the terahertz radiation can be detected (coherent detection).

The photoconductive layer must consist of a material which among other things provides for an ultrafast recombination of the generated charge carriers (e.g. with recombination times of less than one picosecond), so that the generated photocurrent can at least approximately follow the modulated illumination. Furthermore, the material of the photoconductive layer should have a mobility of the photocharge carriers as high as possible in order to provide for an acceleration of the charge carriers as efficient as possible. One possibility for achieving the shortest possible recombination times is the generation of impurity centers by doping the photoconductor material. According to U.S. Pat. No. 8,809,092 B2, for example, the photoconductive layer is grown by MOVPE, wherein during the epitaxy a doping material (iron) is incorporated. At higher dopant concentrations, however, iron clusters are obtained in this method, which impair the terahertz properties of the photoconductive layer.

SUMMARY

A problem underlying the invention consists in creating a terahertz antenna with the best possible terahertz properties.

This problem is solved by providing a terahertz antenna with features as described herein and by the method with features as described herein.

Accordingly, there is provided a terahertz antenna, comprising at least one photoconductive layer (in the form of an epitaxial semiconductor layer), which upon irradiation of light generates charge carriers;

two electroconductive antenna elements, via which an electric field can be applied to at least one section of the photoconductive layer;

the photoconductive layer is doped with a dopant in a concentration of at least $1 \times 10^{18}$ cm$^{-3}$, the dopant being a transition metal, and wherein the photoconductive layer is produced by molecular beam epitaxy (MBE) at a growth temperature (substrate temperature during the epitaxy) of at least 200° C. and not more than 500° C. (e.g. at a growth temperature between 250° C. or 300° C. and 500° C.), the dopant being arranged in the photoconductive layer such that it produces a plurality of point defects.

For example, the plurality of dopant atoms—while avoiding dopant clusters—each is arranged in the photoconductive layer in the form of a point defect. It is conceivable in particular that substantially all dopant atoms each are arranged in the photoconductive layer in the form of a point defect.

Thus, the photoconductive layer of the terahertz antenna according to the invention in particular includes no or only a small number of dopant clusters, as it is grown at a relatively low temperature (in particular compared with the MOVPE method). The low growth temperature acts against a diffusion of the dopant and hence the formation of clusters. The avoidance or reduction of the formation of clusters provides for the high level of doping of the photoconductive layer. For example, the dopant concentration even can be at least $5 \times 10^{18}$ cm$^{-3}$, at least $1 \times 10^{19}$ cm$^{-3}$ or at least $1 \times 10^{20}$ cm$^{-3}$, wherein—when substantially each dopant atom is incorporated into the photoconductive layer as a point defect—the dopant concentration substantially corresponds to the concentration of the point defects of the photoconductive layer.

The dopant thus is arranged in the photoconductive layer such that it produces a plurality of point defects and hence recombination centers. As mentioned above, a lower limit of the growth temperature is about 200° C., 250° C. or 300° C. in order to avoid an increased formation of crystal defects as far as possible. The photoconductive layer thus can have the best possible crystal quality at a high level of doping, so that it has a dark resistance as high as possible and provides for very short recombination times as well as a high mobility of the generated photocharge carriers.

Furthermore, the photoconductive layer in particular is configured such that it generates charge carriers upon irradiation of light in a wavelength range between 1000 and 1650 nm. For example, the photoconductive layer is configured for the generation of charge carriers upon excitation with radiation in a wavelength range of 1400-1650 nm or 1000-1600 nm (in particular optimized). For example, the at least one photoconductive layer consists of (In, Ga)As, (In, Ga)(As, P) or (In, Ga, Al)(As, P), in particular of InGaAs, InGaAsP or InAlAs. It is also conceivable that a plurality of photoconductive layers is present and/or the photoconductive layer is part of a layer package (which e.g. beside the at least one photoconductive layer comprises further, not necessarily photoconductive layers, e.g. a buffer layer). A useful substrate material in particular is indium phosphide or gallium arsenide (e.g. semi-insulating).

In particular, the photoconductive layer also has a thickness of at least 100 nm, at least 300 nm or at least 500 nm.

The dopant with which the photoconductive layer is doped for example is a transition metal, e.g. iron, chromium, ruthenium, rhodium and/or iridium.

The antenna elements of the terahertz antenna according to the invention in particular form a bow-tie structure, a dipole-tie structure or a strip-line structure.

It is also conceivable that the photoconductive layer forms a mesa structure, wherein the antenna elements each are connected to a side wall (which each extends perpendicularly to the substrate) of the mesa structure.

It is also possible that the illumination of the photoconductive layer is effected via at least one (in particular integrated) waveguide; for example, the light is coupled into the photoconductive layer laterally (via a front side of the photoconductive layer) via the waveguide. In addition, the photoconductive layer can have an illuminable area which is connected to the antenna elements via protrusions ("fingers").

The terahertz antenna according to the invention can be used e.g. as a terahertz transmitter and/or as a coherent terahertz receiver (or as part of a terahertz transmitter and/or as part of a terahertz receiver) both in terahertz pulse systems (light is irradiated onto the photoconductive layer in the form of optical pulses) and in terahertz continuous-wave systems (CW systems); i.e. in systems in which modulated CW light is irradiated onto the photoconductive layer.

Correspondingly, the invention also relates to a terahertz converter for generating and/or receiving terahertz radiation, wherein the terahertz converter includes at least one terahertz antenna according to any of the exemplary embodiments described above.

For example, the terahertz converter comprises a first and a second terahertz antenna, which each are configured according to any of the exemplary embodiments described above, wherein the photoconductive layers of the first and the second terahertz antenna are sections of a common photoconductive layer. In other words, this terahertz converter includes a first antenna pair (transmitting antenna pair) which together with a second antenna pair (receiving antenna pair) is arranged on a common photoconductive layer or a common photoconductive layer package (i.e. monolithically integrated).

The invention furthermore relates to a method for producing a terahertz antenna, in particular as described above, comprising the following steps:

producing at least one photoconductive layer which generates charge carriers upon irradiation of light, wherein the photoconductive layer is doped with a dopant in a concentration of at least $1\times10^{18}$ cm$^{-3}$, the dopant being a transition metal; and two electroconductive antenna elements are produced, via which an electric voltage can be applied to at least one section of the photoconductive layer, wherein the photoconductive layer is produced by molecular beam epitaxy at a growth temperature of at least 200° C. and not more than 500° C., and doping is effected during the process of epitaxy.

Growing of the photoconductive layer hence is effected at relatively low temperatures, as already mentioned above. In particular, the growth temperature is distinctly lower than in the case of MOVPE, in which chemical reactions on the substrate surface must be made possible, which requires higher temperatures e.g. in the range of 600° C.

For example, the growth temperature lies between 250° C. or 300° C. and 500° C. In one exemplary embodiment of the method according to the invention the substrate temperature during the process of epitaxy is not more than 450° C. or not more than 400° C. It is also conceivable that after growing the photoconductive layer a tempering step is performed, in particular in the form of an annealing step. For example, during the tempering step the photoconductive layer is exposed to a higher temperature compared with the growth temperature. It is also conceivable that during the tempering step the photoconductive layer is present in a stabilizing atmosphere. It is also possible that the tempering step is effected directly after completion of the growing of the photoconductive layer (or of the plurality of photoconductive layers), wherein in particular a contact of the photoconductive layer with air is avoided. In particular, the tempering step is carried out in the MBE system used for growing the photoconductive layer.

The embodiments described above with respect to the terahertz antenna according to the invention can of course correspondingly serve for the development of the method according to the invention. For example, the photoconductive layer is grown with a thickness of at least 100 nm, at least 300 nm or at least 500 nm.

BRIEF DESCRIPTION OF THE DRAWING

The invention will be explained in detail below by means of exemplary embodiments with reference to the Figures.

DETAILED DESCRIPTION

Figure 1:
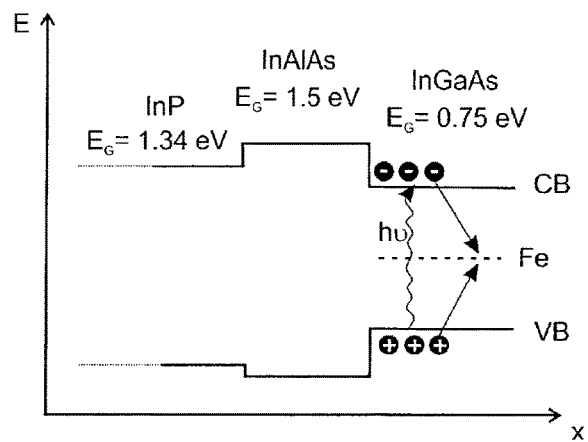
FIG. 1 schematically shows a band diagram of a photoconductive InGaAs layer grown on an indium phosphide substrate.

The band diagram shown in FIG. 1 refers to a possible configuration of the photoconductive layer of the terahertz antenna according to the invention. The photoconductive layer here is configured in the form of an InGaAs layer which has been grown on an InP substrate in a lattice-matched manner. Between the InGaAs layer and the InP substrate an InAlAs buffer layer is present. In the diagram, the respective band gaps are indicated (CB: conduction band; VB: valence band).

In the middle of the band gap of the InGaAs layer there is the energy level (broken line) of point-like recombination centers, which were produced by doping the InGaAs layer with a transition metal (e.g. Fe).

When light ("hv"), e.g. in the form of a laser pulse with a center wavelength of 1550 nm, impinges on the InGaAs layer, electrons from the valence band VB are excited into the conduction band CB and correspondingly electron-hole pairs are produced.

The excited electrons are accelerated by a voltage applied to the InGaAs layer, wherein the accelerated electrons emit terahertz radiation. The produced electron-hole pairs recombine in the recombination centers, wherein the recombination time is very short due to the point-like recombination centers produced by doping. The InAlAs buffer layer and the substrate are not involved in the generation of the electron-hole pairs due to their larger band gap.

Figure 2:
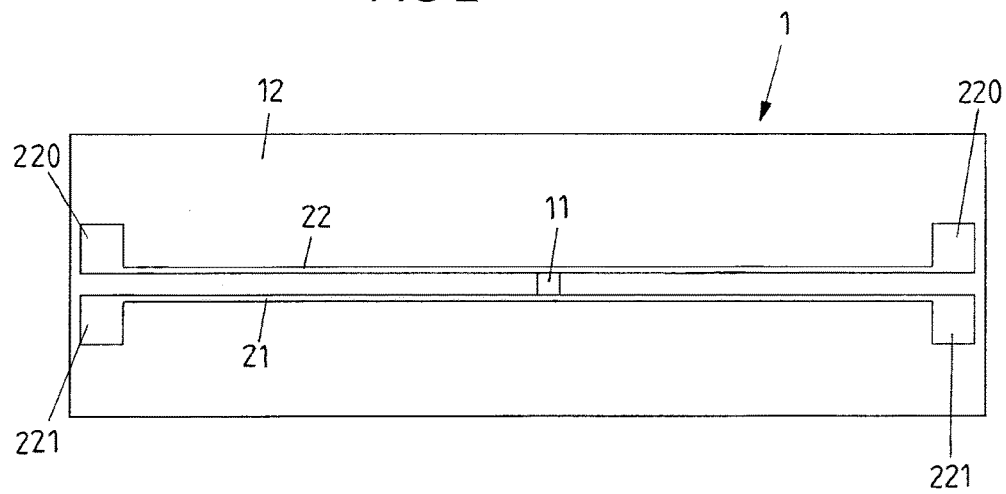
FIG. 2 shows a top view of a terahertz antenna according to an exemplary embodiment of the invention.

FIG. 2 shows a top view of a terahertz antenna 1 according to the invention. The terahertz antenna 1 includes a photoconductive semiconductor layer 11 produced by MBE on a substrate 12 (e.g. a semi-insulating InP substrate), which forms a cuboid mesa structure. In addition, the photoconductive semiconductor layer 11 has a higher concentration (at least $1\times10^{18}$ cm$^{-3}$) of a dopant (e.g. iron). It is conceivable that the photoconductive semiconductor layer 11 is formed of doped InGaAs or includes such a material.

In addition, the terahertz antenna 1 has a first and a second strip-like antenna element 21, 22 which each is arranged on the substrate 12. The antenna elements 21, 22 are formed of a metal and were deposited (e.g. vapor-deposited) on the substrate 12.

Furthermore, the antenna elements 21, 22 extending parallel to each other each are electrically connected to one side of the photoconductive semiconductor layer 11, so that via the antenna elements 21, 22 a voltage can be applied to the semiconductor layer 11. For the connection of a voltage source the antenna elements 21, 22 each have contact surfaces 210, 220.

The invention claimed is:

1. A terahertz antenna, comprising:
   at least one photoconductive layer which generates charge carriers upon irradiation of light; and
   two electroconductive antenna elements via which an electric field can be applied to at least one section of the photoconductive layer, wherein:
      the photoconductive layer being doped with a dopant in a concentration of at least $1\times10^{18}$ cm$^{-3}$, the dopant being a transition metal, and
      the photoconductive layer is produced by molecular beam epitaxy at a growth temperature of at least 200° C. and not more than 500° C., the dopant being arranged in the photoconductive layer such that it produces a plurality of point defects.

2. The terahertz antenna according to claim 1, wherein the plurality of dopant atoms each are arranged in the photoconductive layer in the form of a point defect or substantially all dopant atoms each are arranged in the photoconductive layer in the form of a point defect.

3. The terahertz antenna according to claim 1, wherein the photoconductive layer has no or only a small number of dopant clusters.

4. The terahertz antenna according to claim 1, wherein the concentration of the dopant is at least $5\times10^{18}$ cm$^{-3}$, at least $1\times10^{19}$ cm$^{-3}$ or at least $1\times10^{20}$ cm$^{-3}$.

5. The terahertz antenna according to claim 1, wherein the photoconductive layer is configured such that it generates charge carriers upon irradiation of light in a wavelength range between 1000 and 1650 nm.

6. The terahertz antenna according to claim 1, wherein the photoconductive layer is formed of (In, Ga)As, (In, Ga)(As, P) or (In, Ga, Al)(As, P).

7. The terahertz antenna according to claim 1, wherein the photoconductive layer has a thickness of at least 100 nm, at least 300 nm or at least 500 nm.

8. The terahertz antenna according to claim 1, wherein the photoconductive layer is grown on a semi-insulating substrate.

9. The terahertz antenna according to claim 1, wherein the dopant is iron, ruthenium, rhodium and/or iridium.

10. The terahertz antenna according to claim 1, wherein the photoconductive layer forms a mesa structure, wherein the antenna elements each are connected to a side wall of the mesa structure.

11. A terahertz converter for generating and/or receiving terahertz radiation, wherein the terahertz converter includes at least one terahertz antenna according to claim 1.

12. The terahertz converter according to claim 11, comprising a first and a second terahertz antenna, which each are configured according to any of the preceding claims, wherein the photoconductive layers of the first and the second terahertz antenna are sections of a common photoconductive layer.

13. A method for producing a terahertz antenna, comprising the following steps:
   producing at least one photoconductive layer which generates charge carriers upon irradiation of light;
   doping of the photoconductive layer with a dopant in a concentration of at least $1\times10^{18}$ cm$^{-3}$, the dopant being a transition metal; and
   producing two electroconductive antenna elements, via which an electric voltage can be applied to at least one section of the photoconductive layer, wherein:
      the photoconductive layer is produced by molecular beam epitaxy at a growth temperature of at least 200° C. and not more than 500° C., and doping is effected during the process of epitaxy.

14. The method according to claim 13, wherein the growth temperature lies between 250° C. or 300° C. and 500° C.

15. The method according to claim 13, wherein the growth temperature is not more than 450° C. or not more than 400° C.

16. The method according to claim 13, wherein after growing the photoconductive layer a tempering step is performed.

* * * * *